United States Patent
Roche et al.

(10) Patent No.: US 11,621,390 B2
(45) Date of Patent: Apr. 4, 2023

(54) PIEZOELECTRIC VIBRATION SENSOR

(71) Applicant: CTRL Systems Inc., Westminster, MD (US)

(72) Inventors: Robert Henry Roche, Westminster, MD (US); David Andrew Roche, Littlestown, PA (US); Robert Matthew Roche, Laurel, MD (US)

(73) Assignee: CTRL Systems Inc., Westminster, MD (US)

( * ) Notice: Subject to any disclaimer, the term of this patent is extended or adjusted under 35 U.S.C. 154(b) by 0 days.

(21) Appl. No.: 17/494,049

(22) Filed: Oct. 5, 2021

(65) Prior Publication Data
US 2022/0029085 A1    Jan. 27, 2022

Related U.S. Application Data

(63) Continuation of application No. 15/970,430, filed on May 3, 2018, now Pat. No. 11,152,560.

(60) Provisional application No. 62/501,417, filed on May 4, 2017.

(51) Int. Cl.

| | | |
|---|---|---|
| H01L 41/053 | (2006.01) | |
| H01L 41/113 | (2006.01) | |
| H04R 17/10 | (2006.01) | |
| G01H 11/08 | (2006.01) | |
| H04R 17/02 | (2006.01) | |
| G01H 1/00 | (2006.01) | |

(52) U.S. Cl.
CPC .......... *H01L 41/053* (2013.01); *G01H 1/003* (2013.01); *G01H 11/08* (2013.01); *H01L 41/113* (2013.01); *H04R 17/02* (2013.01); *H04R 17/10* (2013.01); *H01L 41/1132* (2013.01)

(58) Field of Classification Search
CPC ... H01L 41/053; H01L 41/113; H01L 41/1132
USPC .................................................. 310/338, 339
See application file for complete search history.

(56) References Cited

U.S. PATENT DOCUMENTS

| | | | | |
|---|---|---|---|---|
| 4,430,595 A | * | 2/1984 | Nakasone | ............... H01L 41/08 310/339 |
| 8,446,069 B2 | * | 5/2013 | Monig | ................. H03K 17/964 310/319 |
| 2012/0267984 A1 | * | 10/2012 | Shaban | .................... H02N 2/18 310/339 |

* cited by examiner

*Primary Examiner* — Derek J Rosenau
(74) *Attorney, Agent, or Firm* — Hanrahan Law Firm, P.A.; Benjamin M. Hanrahan

(57) ABSTRACT

A contact sensor for the repeatable detection of small, high frequency mechanical vibrations in external systems is presented herein. The sensor includes a metal housing with an attachment device at one end and an output at the other end. Inside the metal housing is a core assembly that includes a piezo transducer assembly suspended or isolated between an actuator and a biasing device. The actuator may be in the form of a ceramic sphere that sits at least partially within a recess on the inside of the housing and is in physical contact with the piezo transducer assembly. The biasing device may be in the form of a spring that causes the piezo transducer assembly to be pressed against the actuator at a contestant and known amount of tension.

16 Claims, 5 Drawing Sheets

PIEZOELECTRIC VIBRATION SENSOR

CLAIM OF PRIORITY/CROSS REFERENCE TO RELATED APPLICATION

The present application is a Continuation Patent Application of previously-filed, currently-pending U.S. patent application Ser. No. 15/970,430 filed on May 3, 2018, which is based on and claims priority under 35 U.S.C. § 119(e) to U.S. Provisional Patent Application No. 62/501,417 filed on May 4, 2017.

The contents of each of the above-referenced prior patent applications, namely, U.S. patent application Ser. No. 15/970,430 filed on May 3, 2018 and U.S. Provisional Patent Application No. 62/501,417 filed on May 4, 2017, are incorporated herein in their entirety by reference.

FIELD OF THE INVENTION

The present invention is generally directed to a sensor, and in particular, a contact sensor for detecting vibrations present in mechanical, rotational, electrical, pressurized or other external systems or equipment. The sensor may be fixedly attached or removably mounted to the system or equipment that is to be measured, and in some cases, the contact or vibration sensor may be sensitive to a small or narrow range of vibration frequencies via a suspended or isolated piezoelectric transducer.

BACKGROUND OF THE INVENTION

Contact probes are used to detect the presence of vibrations or frequencies in various systems including, but certainly not limited to rotating equipment, for example. Many of these devices are handheld probes or wands that are sensitive to mechanical resonance via the use or incorporation of a transducer, such as a piezoelectric transducer. For example, a piezoelectric transducer will bend or deform in the presence of vibrations imparted by the piping or other system that is being tested. However, the piezoelectric transducer in many contact probes can be sensitive to a number of other extraneous vibrations or signals not generated by the system, which can, therefore generate false or misleading information.

For example, in addition to the vibrations that may be caused by or are present in the system or equipment being tested, sound waves or other vibrations in the surrounding air can have an impact on the piezoelectric transducer. In addition, the user holding or operating the contact sensor can potentially impart some vibrations or noise to the transducer. For example, the pressure with which the user holds the contact sensor against the system may have an impact on the piezoelectric transducer. Specifically, even if the user attempts to hold the sensor steady and at a constant pressure against the system or equipment, there will be some movement, variance or some degree of unsteadiness that can impact the piezoelectric transducer.

These, and many other extraneous vibrations or signals, can cause the contact sensor to generate false reads or misleading information.

Accordingly, there is a need in the art for a new contact sensor that can effectively isolate the piezoelectric transducer to minimize, reduce and in many cases, eliminate extraneous signals being imparted onto the transducer. It would also be beneficial for the proposed contact sensor to provide enhanced sensitivity to small vibrations, for example, those that may be in the range of 40-50 kHz.

SUMMARY OF THE INVENTION

The present invention is generally directed to a contact sensor or probe that includes a housing with an attachment bolt, or other attachment mechanism, at one end and an electrical connector, output or transmitter at the other end, for example. In some embodiments, the housing may be constructed of a metal, although other materials are contemplated. Inside the housing is a core assembly that includes a piezoelectric (or other like) transducer suspended or isolated between an actuator and a biasing device. For instance, the actuator, in some cases, may be in the form of a sphere or ball that sits at least partially within a recess on the inside of the housing and is in contact or engagement with the piezoelectric transducer assembly. In particular, the spherical configuration allows the actuator to be in small or minimal contact with the transducer assembly, although enough contact to transfer vibrations within the spirit and scope of the various embodiments of the present invention. In at least one embodiment the actuator may be constructed of ceramic, although other materials may be used within the scope of the present invention. Furthermore, as described herein, the biasing device may be a spring or foam backing, for example, that causes the piezo transducer to be pressed against the actuator at a constant and known amount of tension.

In this manner, the contact sensor of the various embodiments of the present invention allows for the repeatable detection of very small, high frequency mechanical vibrations in external systems to which the contact sensor is mounted or attached. For instance, the external system may be any mechanical, electrical, rotational or pressurized system or equipment, and the vibrations detected by the contact sensor may often correlate with or be determinative of the presence of undesirable conditions such as leaks, electrical discharges, or mechanical wear or failure.

In many embodiments, the contact sensor of the present invention provides enhanced sensitivity for the detection of small vibrations, which in some instances may be in the range of 40-50 kHz, although other ranges, either higher or lower, may be detected. For instance, the contact sensor may be modified to enable a variety of frequencies to be detected, for example, by adjusting the size and/or thickness of the piezo element or wafer, and in some cases, the housing, too.

In particular, the vibrations or signals may be transferred through the housing of the contact sensor to the actuator, which, as mentioned herein, may, in some cases, be a ceramic sphere or ball. Since the ceramic sphere or actuator is in contact with and disposed between the housing and the piezo transducer (e.g., the transducer is held in tension against the ceramic sphere or actuator via a spring, foam backing or other biasing device or mechanism), any vibrations or signals transferred from the housing to the actuator will be imparted directly to the piezo transducer.

The piezo transducer will then transmit the detected signal to a PCB (printed circuit board), control board, processor, and/or an output/connector extending out of the housing. In this manner, external processing equipment, wires, cables, etc. can be connected to the output in order to receive, store or further process the data detected by the contact sensor of the present invention.

Alternate electrical connectors can be incorporated into the sensor to enable additional equipment to receive the signals. Also, some embodiments may include pre-conditioning electronics or modules, for example, to enable buffering, signal filtering, and/or amplification using signal conditioning methods or techniques.

These and other objects, features and advantages of the present invention will become more apparent when the drawings as well as the detailed description are taken into consideration.

BRIEF DESCRIPTION OF THE DRAWINGS

Like reference numerals refer to like parts throughout the several views of the drawings provided herein.

DETAILED DESCRIPTION OF THE INVENTION

Figure 1:
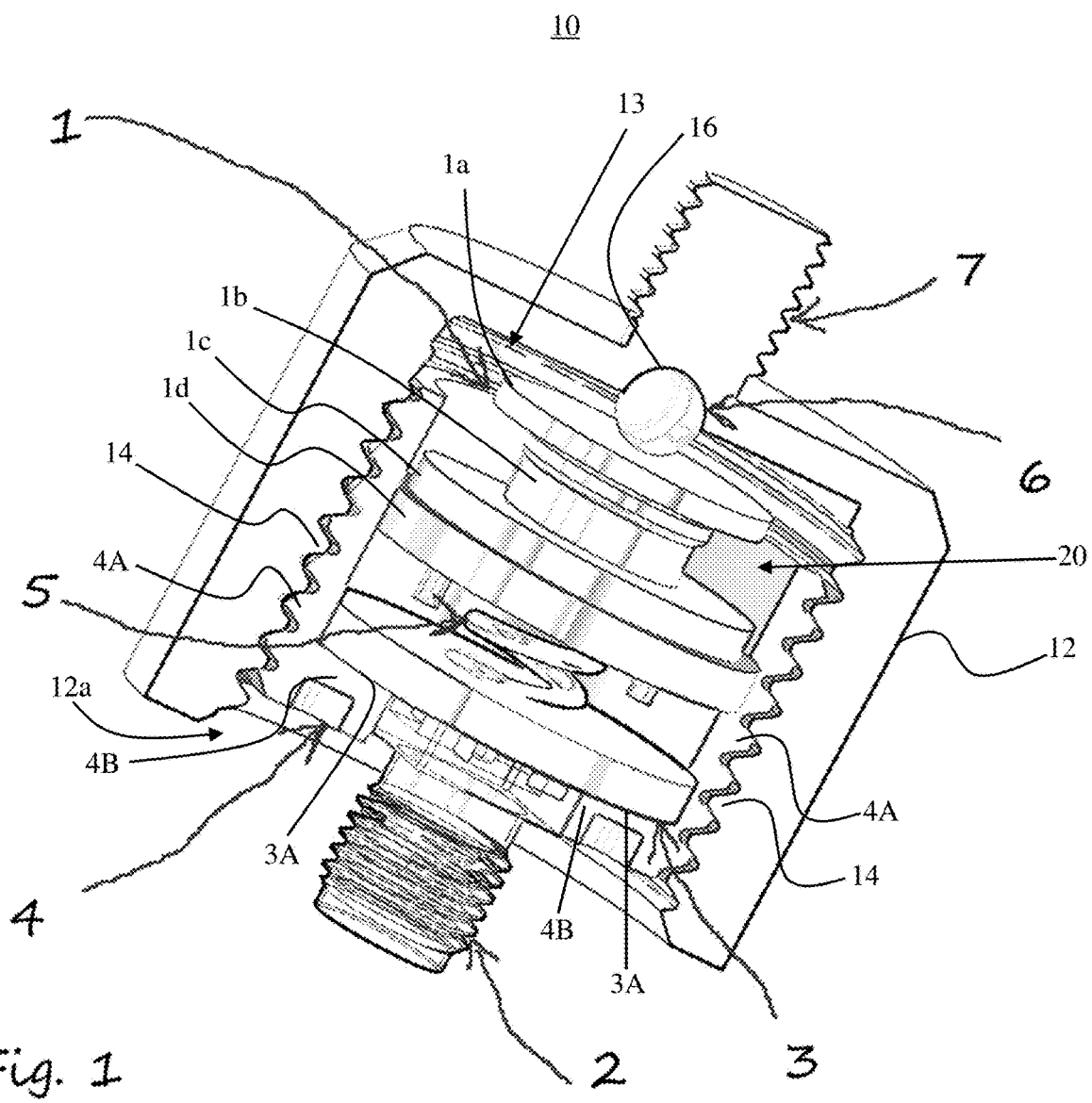
FIG. 1 is a cut away view of the contact sensor and core assembly as disclosed in accordance with at least one embodiment of the present invention.
Figure 2:
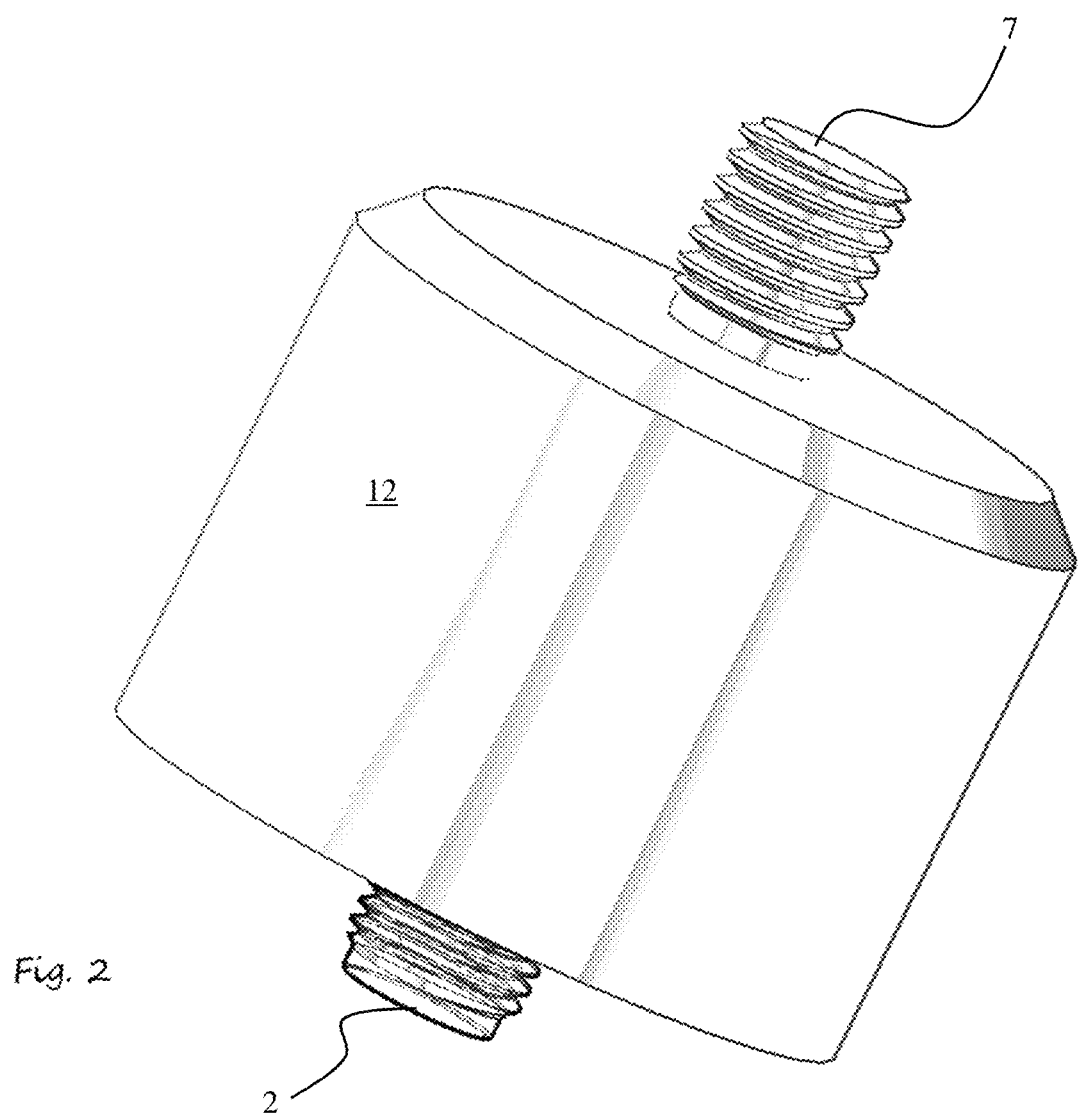
FIG. 2 is a partial perspective view of the contact sensor as disclosed in accordance with at least one embodiment of the present invention.
Figure 3A:
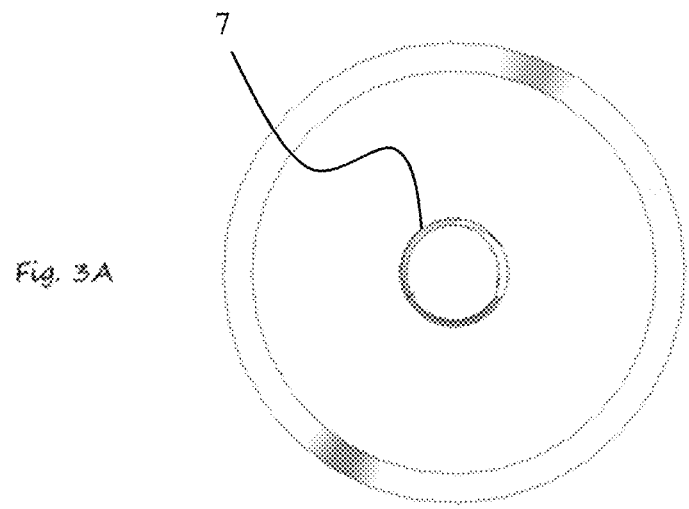
FIG. 3A is a top view of the contact sensor of at least one embodiment of the present invention.
Figure 3B:
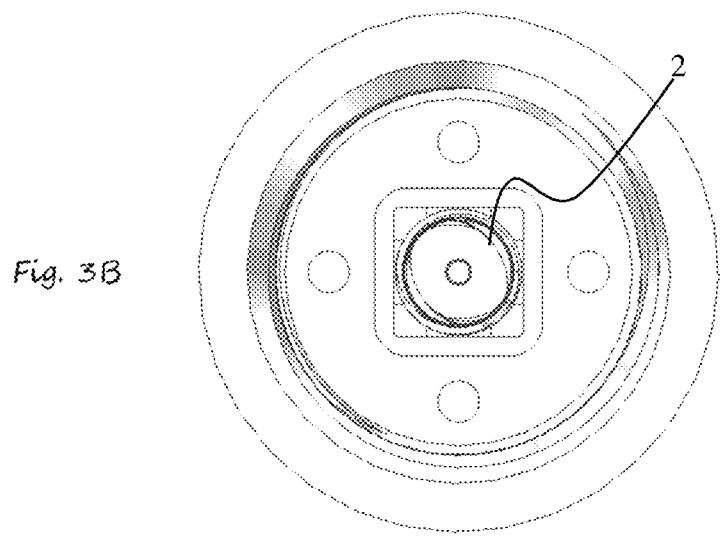
FIG. 3B is a bottom view of the contact sensor of at least one embodiment of the present invention.
Figure 3C:
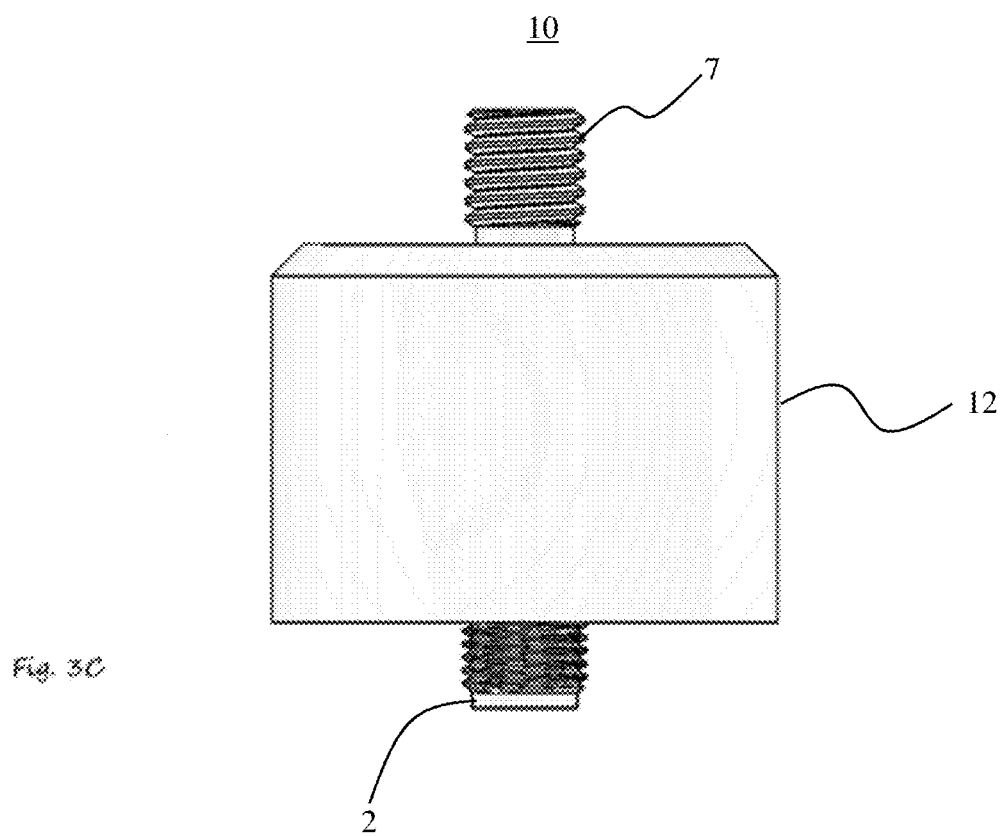
FIG. 3C is a side view of the contact sensor of at least one embodiment of the present invention.

As shown in the accompanying drawings, and with particular reference to FIGS. 1 and 2, for example, the present invention is directed to a contact sensor, generally shown as 10, for detecting vibrations or other movements in other systems or equipment. FIGS. 3A, 3B, and 3C show a top, bottom and side view, respectively, of at least one exemplary embodiment of the contact sensor 10 of the present invention. It should be noted that any dimensions, sizes or ratios illustrated or mentioned herein should be considered exemplary and not limited in any manner.

For instance, in some embodiments, the contact sensor 10 of the present invention may operate to detect a narrow range of vibration frequencies between approximately 40 kHz and 50 kHz, although other ranges higher or even lower than this are contemplated within the full spirit and scope of the present invention. In this manner, the contact sensor 10 can be used to accurately detect small mechanical vibrations, water leaks in a piping system, mechanical failure or wear, etc.

In particular, the contact sensor 10 of at least one embodiment of the present invention includes a housing 12, which can be constructed of a durable and preferably rigid material such as metal, although other materials may be contemplated. Also, as shown in the embodiment of FIGS. 1 and 2, the housing 12 may include a general cylindrical shape or configuration with an attachment piece or device 7 on one end and an output connector 2 on the other end. However, it should be noted that other shapes, sizes and configurations, as well as locations of the attachment piece or device 7 and/or the output connector 2 are contemplated within the scope of the various embodiments disclosed herein.

For instance, the attachment piece or device, represented as 7, may be used to connect, mount or fixedly attach the contact sensor 10, and in particular, the housing 12, to the external system, such as any mechanical, electrical, rotational, or pressurized system or equipment (not shown) of which the contact sensor 10 will measure or detect vibrations or other movements. Particularly, the attachment piece or device 7 may attach or mount directly to the system or equipment to be tested. In some cases, however, the attachment piece or device 7 may attach or mount to an adapter, intermediate mount, screw, etc., that, in turn, attaches or mounts to the system or equipment. As an example, the adapter (not shown) may include a magnet such that the attachment piece or device 7 of the present invention screws into or otherwise attaches to the adapter, and the adapter is magnetically coupled to the system or equipment. Of course, other attachment devices, adapters, etc. are contemplated in the full spirit and scope of the present invention.

In this manner, and as just an example, the external system may be a piping system through which water or other fluid flows. In such a case, the contact sensor 10 of the present invention may be operable to accurately detect the presence of vibrations or movements commonly associated with or determinative of a leak in the system, for example.

In any event, the attachment piece or device 7 may include a threaded protrusion or extension as shown in FIGS. 1 and 2, for example, which may cooperatively attach or screw onto a corresponding mount or piece attached to the external system (not shown), or as mentioned above, to an adapter or other intermediate attachment device. As just an example, the attachment piece 7 may be a grease fitting or a ZERK fitting, although virtually any fitting, connection, or adapter may be used in order to facilitate the fixed or removable attachment of the contact sensor 10 to an external or other system or equipment. For instance, many embodiments may include any attachment piece(s) or device(s) that allow(s) the contact sensor 10 of the present invention to be mounted to the system, either removably mounted, fixedly mounted or permanently mounted.

Figure 4:
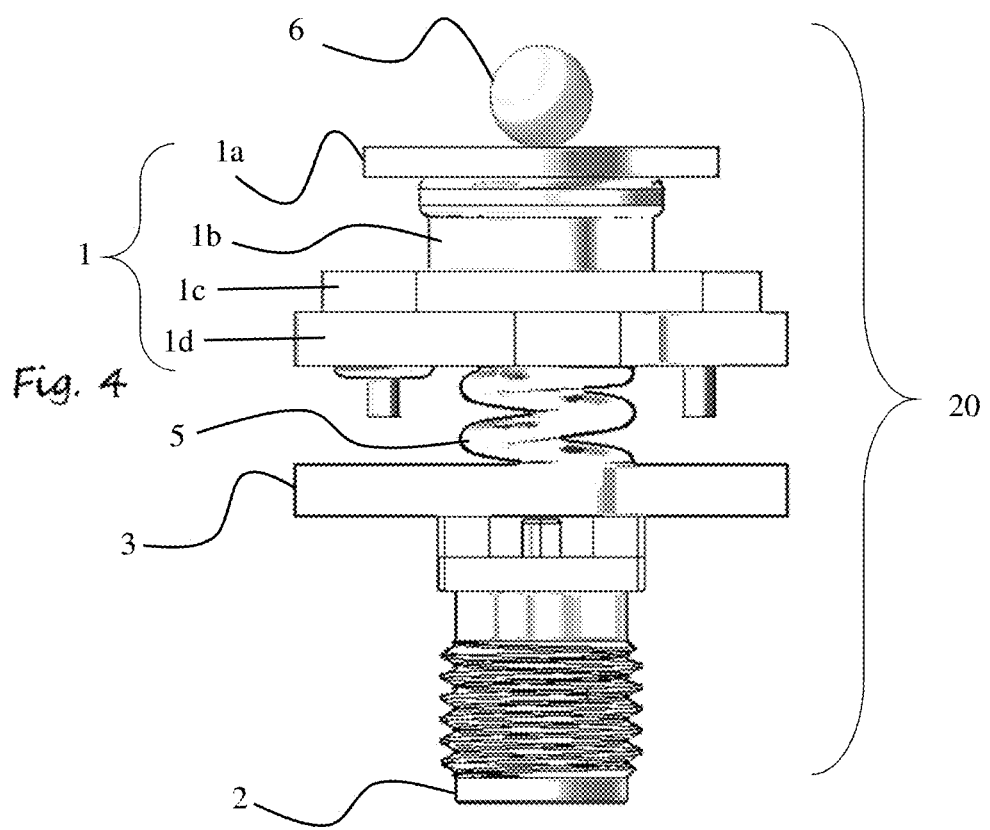
FIG. 4 is a side elevation view of the core assembly as disclosed in accordance with at least one embodiment of the present invention.

Furthermore, as shown in FIGS. 1 and 4, the contact sensor 10 of at least one embodiment of the present invention includes a core assembly 20 which may include, for example, a transducer or transducer assembly 1, an activator 6, and a biasing device 5. For instance, the transducer 1 of at least one embodiment may include one or more piezo or piezoelectric element(s), stack(s), wafer(s), etc. that is/are capable of generating a current or other electrical signal when the piezo element(s) is/are bent or deformed from vibrations or other movements. For example, the transducer or transducer assembly 1 may include one or more contact wafers or discs, represented as 1a, as well as one or more structural support elements shows as 1b, 1c, 1d. Collectively, the contact wafer or disc 1a and the at least one structural or additional elements 1b, 1c, 1d, are referred to herein as the transducer, transducer assembly, piezo, or piezo assembly, and referenced as 1. As provided, the transducer assembly 1 is structured and configured to detect vibrations or other movements imparted thereto via the actuator 6, which in some embodiments is a ball or spherical element. Furthermore, as described and shown herein, in at least one embodiment, the piezo element or transducer assembly 1 may be suspended, isolated or disposed between the activator 6 and the biasing device 5 in that the transducer assembly 1 only contacts the actuator 6 and the biasing device 5. In such an embodiment, the transducer assembly 1 makes no additional contacts with the housing 12 or core mounting assembly 4, as described herein.

Referring to the cut-away view of FIG. 1, the activator 6 is disposed in contact with or between the housing 12 (such as an inner surface or a surface on an interior portion of the housing 12) and the transducer or piezo element 1. Specifically, in at least one embodiment, the housing 12 may include a recess, indent or dimple 16 within which at least a portion of the activator 6 is disposed. The recess, indent or dimple 16 may function to at least partially retain or hold the activator 6 in position. For example, in some embodiments, the activator 6 may be in the form of a sphere or ball bearing, and consequently, the recess, indent or dimple 16 may be similarly sized and shaped (e.g., a partial concave rounded configuration) in order to receive a portion of the activator 6 therein. In particular, the spherical configuration of the activator 6 allows the activator 6 to be in small or minimal contact with the transducer assembly 1, although enough contact to transfer vibrations from the external system to the housing 12 and actuator 6, and then to the transducer assembly 1, within the spirit and scope of the various embodiments of the present invention.

In addition, it should be noted that the activator 6 of at least one embodiment of the present invention may, but need not necessarily, be constructed of ceramic or a substantially ceramic material such that the activator 6, in some cases, may be a ceramic sphere or a ceramic sphere or ball bearing. However, it is contemplated that the activator 6 may be constructed of different materials and in a different shape or configuration.

It should also be noted that in some embodiments, the activator 6 or ceramic ball, as well as the corresponding recess 16, may be positioned proximate to the mount or attachment device 7, and in some cases, below or substantially in line with the mount or attachment device 7, as shown in FIG. 1, for example. For instance, since the activator 6 is structured to transfer vibrations or other movements from the external system, through the mount 7 and/or housing 12, through the activator 6 and to the transducer 1 (e.g., to the contact disc, wafer, or element 1a, thereof), placing the activator 6 proximate the mount 7 or proximate the portion of the housing 12 that may be in contact with the external system can provide accurate results. However, in other embodiments, the location of the activator 6 and recess 16 may be further from the mount 7.

Still referring to FIG. 1, the transducer 1 or piezo element is connected or mounted (either directly or indirectly via one or more mounting structures) to a biasing device 5, which in the embodiment illustrated includes a mechanical or other like spring, although other biasing devices such a foam backing or foam piece are contemplated. For instance, the biasing device 5 may be mounted to or otherwise engage a base 3 at one end and is structured to bias the transducer 1 such that the transducer assembly 1 or piezo element is held in constant tension against the ceramic sphere or activator 6. In this manner, the piezo element or transducer 1 is suspended or mounted between the activator 6 and the spring or biasing device 5.

Specifically, in at least one embodiment, the transducer assembly 1 (including the contact element 1a and/or any additional transducer mounting structures or elements 1b, 1c, 1d) is only in contact with the activator 6, on one end, and the biasing device 5, on the other end. For instance, the transducer 1, in some embodiments, may not contact the housing 12 directly, but only indirectly, for example, through the activator 6. Accordingly, the transducer 1 of such an embodiment is suspended between the activator 6 and the biasing device 5 and does not contact any other components, walls or surfaces. The biasing device 5 provides constant pressure against the transducer 1, thereby minimizing or even eliminating potential interferences that can distort the transducer's effectiveness.

Furthermore, a printed circuit board (PCB) or other circuit board, controller, or like device may be part of the core assembly 20, for example, as part of the base 3 or other component or core assembly. The PCB or other like device may be used to receive the signals from the transducer 1, which can then be stored, processed and/or transmitted to external processing equipment (not shown) or a cable (not shown) via an output connector 2. For instance, the output connector 2 may be in the form of a BNC connector, such as a Micro-BNC connector, or other like connector that can communicate the signals developed by the transducer 1 and/or the PCB to external equipment or devices. In some cases, the output 2 may be a wire, and in other embodiments, the output 2 may transmit the signal(s) wirelessly to external devices or equipment.

Still referring to the cut away view of FIG. 1, at least one embodiment of the present invention may further include a core mounting assembly 4 structured to mount or attach the core assembly 20 to the housing 12. In some embodiments the core assembly 20 may be fixedly attached or connected to the core mounting assembly 4, whereas in other embodiments, the core assembly 20 may be connected to the core mounting assembly 4 via pressure, friction or other contact or engagement therewith.

Specifically, in the embodiment illustrated, the housing 12 includes an inner portion 13 with an inner wall having a threaded pattern 14 or other like feature(s) thereon. Similarly, the core mounting assembly 4 may include a corresponding threaded pattern 4A on an outer wall thereof, such that the core mounting assembly 4 can be threaded or screwed into the inner portion 13 of the housing 12, for example, through an open end, generally referenced as 12a. The core mounting assembly 4 may engage, contact or be attached to the core assembly 20 (e.g., at or near the base 3) such that as the core mounting assembly 4 is screwed into the housing 12, the transducer 1 will be pressed against the actuator 6 or ceramic sphere that is seated in the recess 16.

For instance, in at least one embodiment, the core mounting assembly 4 may include a contact ledge 4B that may be attached to or otherwise engages or contacts the base 3, such as a bottom surface 3A of the base 3. This will, therefore, mount the core assembly 20 within the inner portion 13 of the housing 12 while the transducer assembly 1 (e.g., piezo element) is suspended between the biasing device 5 (e.g., spring or foam material) and the actuator 6 (e.g., ceramic sphere), and therefore, the transducer assembly 1 will remain electrically isolated. In this manner, only the vibrations from the actuator 6 will impact the transducer assembly 1, allowing the transducer assembly 1 to provide an accurate and precise reading, sometimes in the narrow range of 40-50 kHz. Extraneous vibrations, movements, or interferences, such as, for example, other impacts on the housing, pressure from a user's hand, or air vibrations, will not impact the transducer assembly 1 in any significant manner, and in many cases, in no manner at all.

Since other modifications and changes varied to fit particular operating requirements and environments will be apparent to those skilled in the art, the invention is not considered limited to the example chosen for purposes of disclosure, and covers all changes and modifications which do not constitute departures from the true spirit and scope of this invention. This written description provides an illustrative explanation and/or account of the present invention. It may be possible to deliver equivalent benefits using variations of the specific embodiments, without departing from the inventive concept. This description and these drawings, therefore, are to be regarded as illustrative and not restrictive.

Now that the invention has been described,

What is claimed is:

1. A contact sensor for detecting vibration in an external system, said contact sensor comprising;
a housing,
an attachment device extending from one portion of said housing,
an output connector extending from another portion of said housing, and
a core assembly disposed within an interior portion of said housing,
said core assembly comprising:
an actuator,
a transducer assembly, and
a biasing device,
wherein said actuator is in contact with an internal surface of said housing proximate said attachment device,
wherein said biasing device is in contact with a base proximate said output connector, and
wherein said transducer assembly is disposed in suspended isolation between said actuator and said biasing device such that said biasing device is configured to bias said transducer assembly against said actuator.

2. The contact sensor as recited in claim 1 wherein said housing further comprises a recess disposed on said internal surface of said internal portion of said housing, said actuator being disposed at least partially within said recess.

3. The contact sensor as recited in claim 2 wherein said actuator comprises a sphere.

4. The contact sensor as recited in claim 3 wherein said sphere is disposed in direct contact with said internal surface of said housing.

5. The contact sensor as recited in claim 4 wherein said sphere is disposed in direct contact with a portion of said transducer assembly.

6. The contact sensor as recited in claim 1 wherein said transducer assembly comprises a piezoelectric element.

7. The contact sensor as recited in claim 1 further comprising a core mount for mounting said core assembly to said housing.

8. The contact sensor as recited in claim 7 wherein said core mount comprises an external wall which engages an internal wall of said housing.

9. The contact sensor as recited in claim 8 wherein said external wall of said core mount comprises threads which engage cooperative threads disposed on said internal wall of said housing.

10. A contact sensor for detecting vibration in an external system, said contact sensor comprising:
a housing,
said housing defining an interior portion and comprising an attachment device and an output connector,
a core assembly disposed at least partially within said interior potion of said housing and comprising a spherical actuator, a piezoelectric transducer assembly, and a biasing device,
wherein said piezoelectric transducer assembly is suspended in isolation between said spherical actuator and said biasing device,
wherein said spherical actuator is disposed in direct contact with an interior surface of said housing and in direct contact with a portion of said piezoelectric transducer assembly, and
wherein a vibration from the external system is transferred to said piezoelectric transducer assembly via said actuator.

11. The contact sensor as recited in claim 8 wherein said housing further comprises a recess disposed of said interior surface, wherein said spherical actuator is seated at least partially within said recess.

12. The contact sensor as recited in claim 11 further comprising a core mount which cooperatively engages said housing, said core mount being structured to mount said core assembly at least partially within said interior portion of said housing with a known tension applied to said biasing device.

13. The contact sensor as recited in claim 12 wherein said core assembly further comprises a base, said biasing device being interconnected between said base and said piezoelectric transducer assembly.

14. The contact sensor as recited in claim 13 wherein said core mount is structured to support said base within said internal portion of said housing.

15. The contact sensor as recited in claim 10 wherein said spherical actuator is disposed in direct contact with said internal surface of said housing proximate said attachment device.

16. The contact sensor as recited in claim 15 wherein said biasing device is disposed in direct contact with a base proximate said output connector.

\* \* \* \* \*